United States Patent [19]

Ueno et al.

[11] Patent Number: 5,561,325

[45] Date of Patent: Oct. 1, 1996

[54] MOUNTING STRUCTURE AND FASTENER FOR HEAT SINK

[75] Inventors: Mitsuhiro Ueno; Toshihiro Kusagaya; Fumio Kurotori, all of Kawasaki, Japan

[73] Assignee: Fujitsu Limited, Kawasaki, Japan

[21] Appl. No.: 426,894

[22] Filed: Apr. 20, 1995

[30] Foreign Application Priority Data

Aug. 1, 1994 [JP] Japan ................................. 6-179857

[51] Int. Cl.⁶ ................................................. H01L 23/34
[52] U.S. Cl. ............................ 257/718; 257/719; 257/722
[58] Field of Search ................................. 257/718, 717, 257/719, 722

[56] References Cited

U.S. PATENT DOCUMENTS

| | | | |
|---|---|---|---|
| 4,745,456 | 5/1988 | Clemens | 257/719 |
| 4,933,746 | 6/1990 | King | 257/718 |
| 5,302,853 | 4/1994 | Volz et al. | 257/718 |
| 5,309,983 | 5/1994 | Bailey | 257/722 |

Primary Examiner—William Mintel
Assistant Examiner—Roy Potter
Attorney, Agent, or Firm—Armstrong, Westerman Hattori, Mcleland & Naughton

[57] ABSTRACT

A heat sink mounting structure which can increase a cooling efficiency and easily mount a heat sink. The heat sink mounting structure includes an integrated circuit package, a heat sink mounted on the integrated circuit package, and a fastener for fastening the heat sink to the integrated circuit package so that a lower surface of the heat sink comes into close contact with an upper surface of the integrated circuit package. The fastener includes a strip member, a pair of forked members integrally connected to opposite ends of the strip member, and a pair of engaging members integrally connected to the pair of forked members. The engaging members are adapted to engage diagonal corner portions of the integrated circuit package, and the forked members are adapted to come into pressure contact with side surfaces of the heat sink.

10 Claims, 15 Drawing Sheets

FIG.17
PRIOR ART

MOUNTING STRUCTURE AND FASTENER FOR HEAT SINK

BACKGROUND OF THE INVENTION

1. Field of the Invention

The present invention relates to a mounting structure for a heat sink to an integrated circuit package.

2. Description of the Related Art

As an example of electronic devices demanded to have small sizes and high reliability, a portable electronic device such as a notebook personal computer has been widely spread on the market in recent years. High performance of such an electronic device requires the use of one or more integrated circuit package having a large heating value.

To ensure the radiation of the integrated circuit package having a large heating value, a heat sink is used in mounting the integrated circuit package on a printed wiring board. The heat sink is required to be mounted on a radiation surface of the integrated circuit package in securely close contact with each other, so as to prevent an increase in thermal resistance due to the contact. In relation with this, the optimization of a mounting structure of the heat sink to the integrated circuit package has been groped for.

Figure 16A:
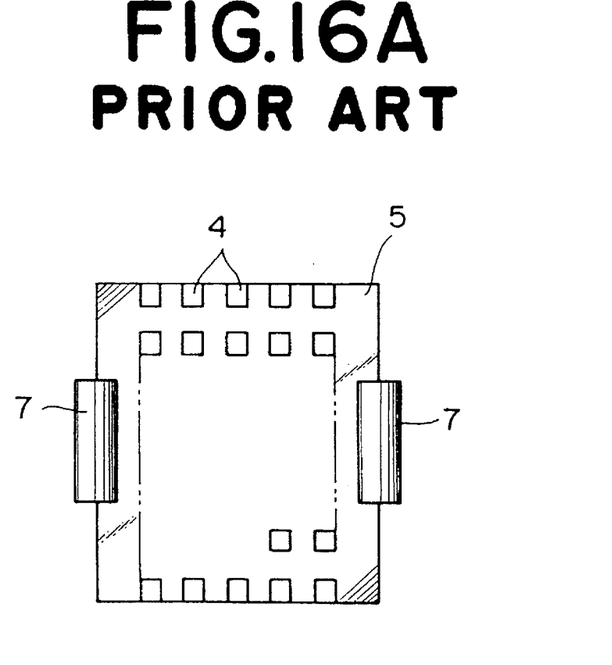
FIGS. 16A and 16B are a top plan view and an elevational view of a heat sink mounting structure in the prior art.
Figure 16B:
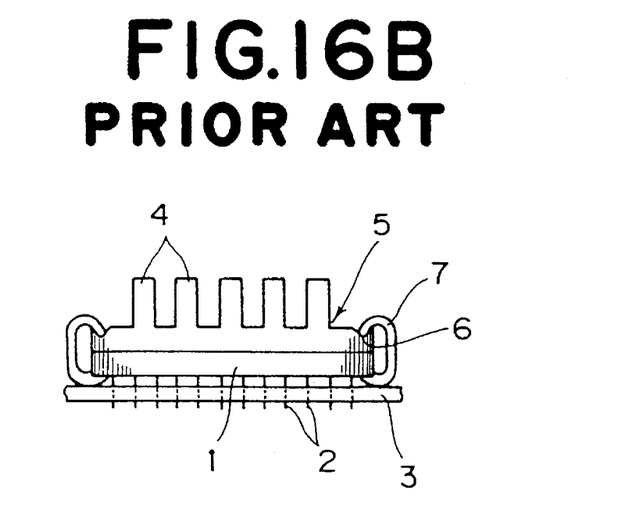

FIGS. 16A and 16B are views for illustrating a conventional mounting structure of a heat sink to an integrated circuit package. Specifically, FIGS. 16A and 16B are a top plan view and an elevational view of the mounting structure. This mounting structure is disclosed in U.S. Pat. No. 5,099,550, for example. As shown in FIGS. 16A and 16B, an integrated circuit package 1 is mounted over a printed wiring board 3 with a small gap defined therebetween by soldering pins 2 of the integrated circuit package 1 to conductor patterns (not shown) of the printed wiring board 3. Recesses 6 are formed on upper edge portions of a heat sink 5 having radiating fins 4, and clips 7 each having a substantially C-shaped cross section are used to hold the heat sink 5 and the integrated circuit package 1 by engagement with the recesses 6 of the heat sink 5 and lower edge portions of the integrated circuit package 1.

Figure 17:
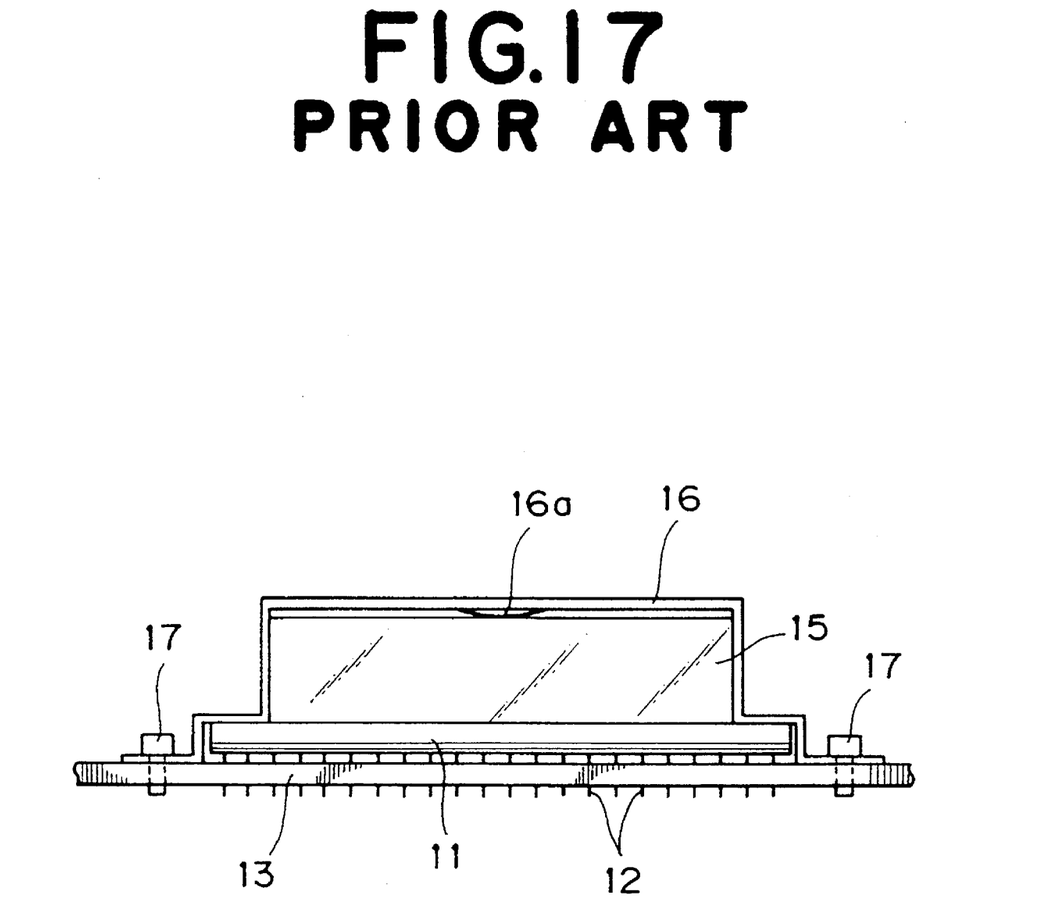
FIG. 17 is an elevational view of another heat sink mounting structure in the prior art.

FIG. 17 shows an elevational view of another conventional mounting structure. As similar to the structure shown in FIGS. 16A and 16B, an integrated circuit package 11 is mounted over a printed wiring board 13 by soldering pins 12 of the integrated circuit package 11 to conductor patterns (not shown) of the printed wiring board 13. Then, a heat sink 15 is fastened to the integrated circuit package 11 by fitting a leaf spring 16 on the heat sink 15 and then fixing the leaf spring 16 to the printed wiring board 13 by means of screws 17. A depressed portion 16a is formed at a substantially central portion of the leaf spring 16. The depressed portion 16a acts to press the heat sink 15, thereby bringing the heat sink 15 into close contact with the integrated circuit package 11.

In the prior art shown in FIGS. 16A and 16B, however, it is necessary to form the relatively large recesses 6 on the upper edge portions of the heat sink 5 because the upper edge portions must be held by the C-shaped clips 7. Accordingly, a radiation area on the heat sink 5 is reduced to cause a decrease in cooling efficiency.

On the other hand, in the prior art shown in FIG. 17, the leaf spring 16 must be fixed to the printed wiring board 13 by using a screwdriver. Accordingly, it is difficult for a user to easily replace the integrated circuit package 11.

SUMMARY OF THE INVENTION

It is therefore an object of the present invention to provide a heat sink mounting structure which can increase a cooling efficiency and easily mount a heat sink.

It is another object of the present invention to provide a fastener to be used to easily fasten a heat sink to an integrated circuit package.

In accordance with a first aspect of the present invention, there is provided a heat sink mounting structure comprising an integrated circuit package; a heat sink mounted on the integrated circuit package; and fastening means for fastening the heat sink to the integrated circuit package so that a lower surface of the heat sink comes into close contact with an upper surface of the integrated circuit package, the fastening means comprising a strip member, a pair of forked members integrally connected to opposite ends of the strip member, and a pair of engaging members integrally connected to the pair of forked members; wherein the engaging members are adapted to engage diagonal corner portions of the integrated circuit package, and the forked members are adapted to come into pressure contact with side surfaces of the heat sink.

Preferably, the strip member has a depressed portion adapted to come into pressure contact with an upper surface of the heat sink, and each of the forked members has a first leg and a second leg substantially perpendicular to the first leg. Each of the first leg and the second leg has a springy pressing portion adapted to come into pressure contact with each of the side surfaces of the heat sink.

In the first aspect of the present invention, the heat sink is fastened to the integrated circuit package by engaging the engaging members of the fastening means with the diagonal corner portions of the integrated circuit package. Accordingly, the heat sink can be easily mounted on the integrated circuit package.

In accordance with a second aspect of the present invention, there is provided a fastener for fastening a heat sink to an integrated circuit package, comprising a strip member; a pair of forked members integrally connected to opposite ends of the strip member, each of the forked members having a first leg and a second leg substantially perpendicular to the first leg; and a pair of engaging members integrally connected to the pair of forked members, each of the engaging members having a lug engaging with a bottom surface of the integrated circuit package at each of diagonal corner portions thereof when the heat sink is fastened to the integrated circuit package.

In accordance with a third aspect of the present invention, there is provided a heat sink mounting structure comprising an integrated circuit package; a heat sink mounted on the integrated circuit package; and fastening means for fastening the heat sink to the integrated circuit package so that a lower surface of the heat sink comes into close contact with an upper surface of the integrated circuit package; wherein the fastening means comprises a first frame for covering an upper edge portion of the heat sink, the first frame having a pressing portion adapted to abut against an upper surface of the heat sink and a plurality of first engaging projections projecting horizontally outward; a second frame for surrounding an outer periphery of the integrated circuit package, the second frame having a lug adapted to abut against a bottom edge portion of the integrated circuit package and a plurality of second engaging projections projecting horizontally outward; and at least a pair of fastening members adapted to engage both the first engaging projections and the second engaging projections, for removably fastening the heat sink to the integrated circuit package.

Also in the heat sink mounting structure according to the third aspect of the present invention, the heat sink can be easily mounted on the integrated circuit package without the use of any tools by only using the first frame, the second frame, and the fixing members.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
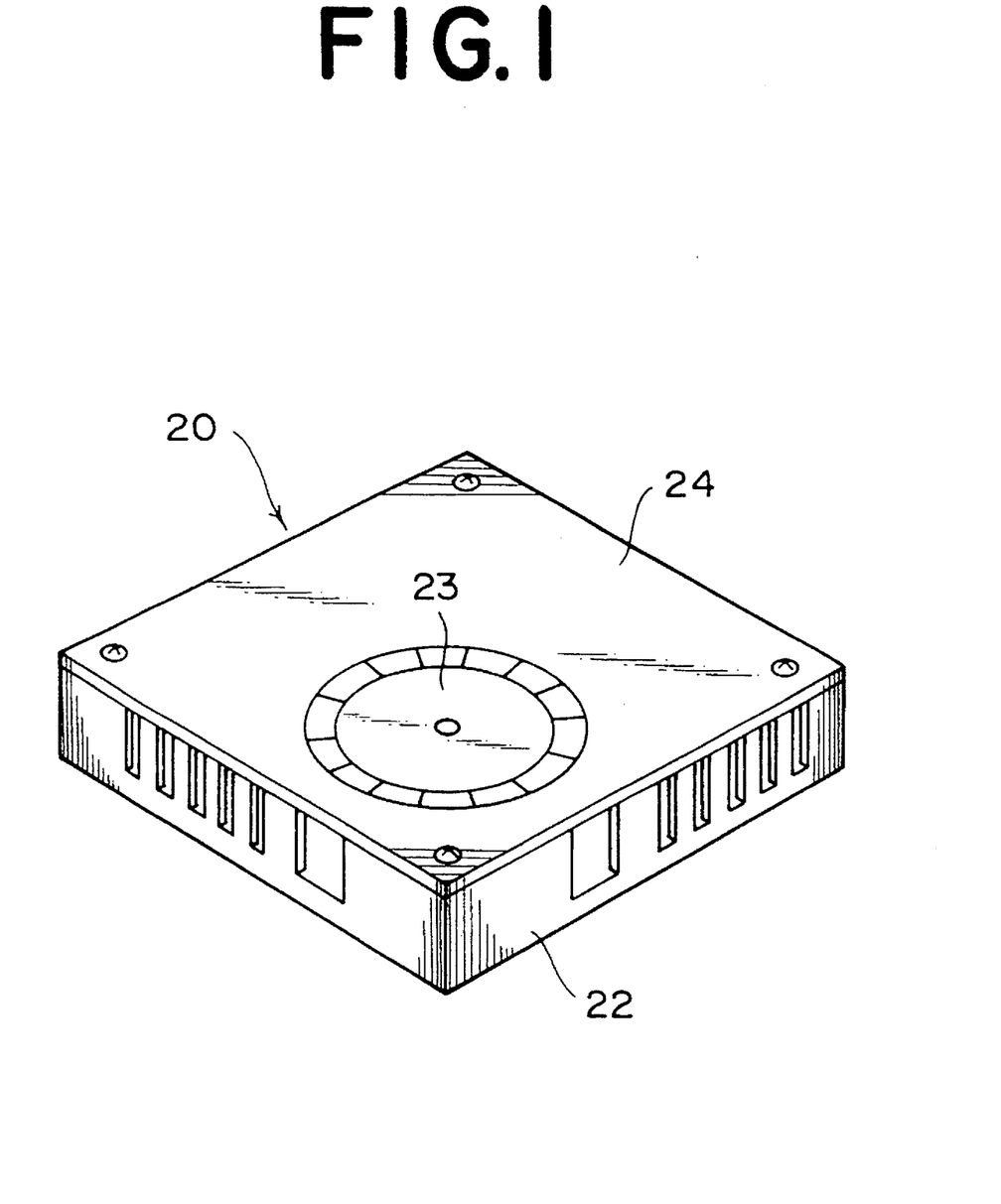
FIG. 1 is a perspective view of a preferred embodiment of a heat sink.
Figure 2:
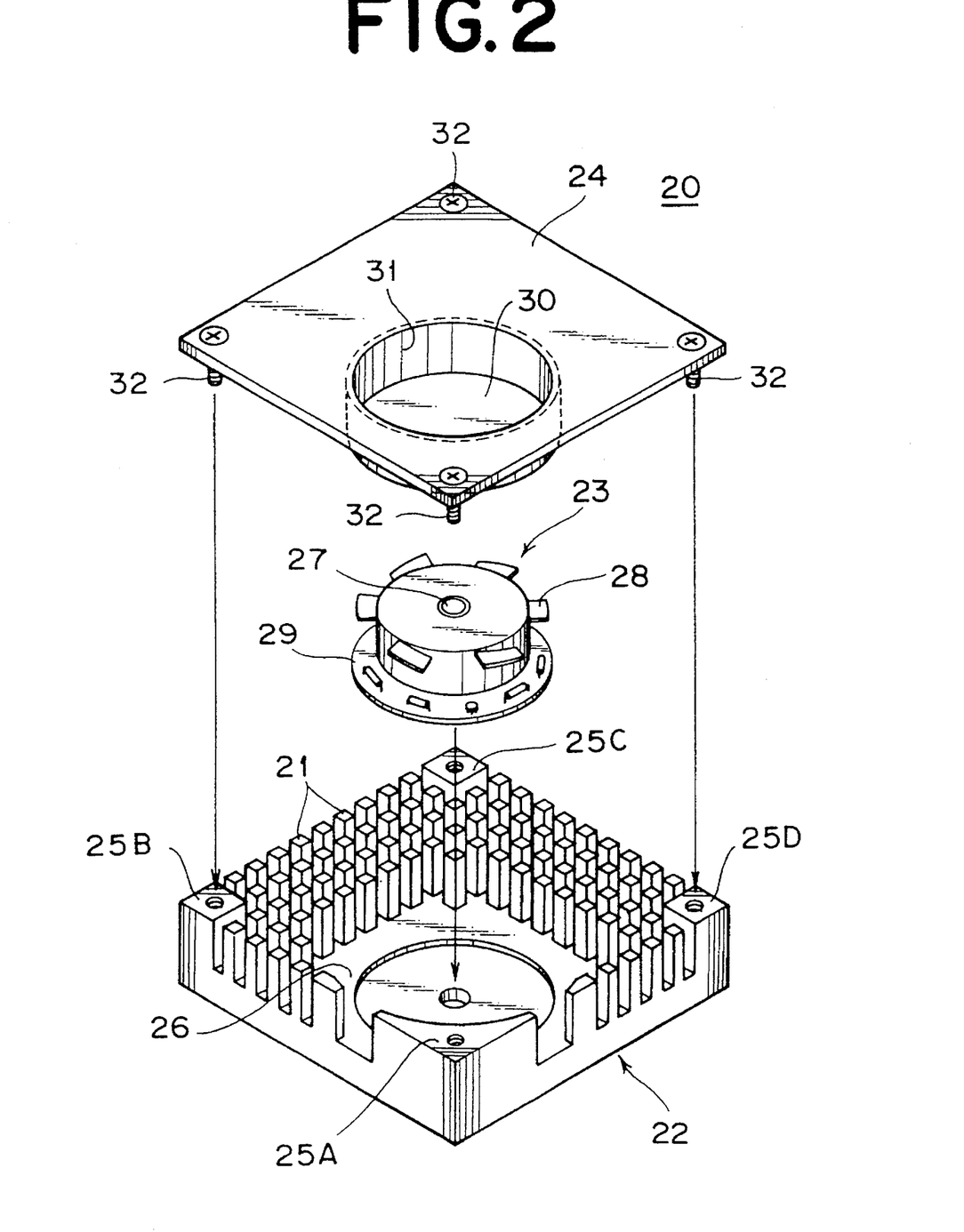
FIG. 2 is an exploded perspective view of the heat sink shown in FIG. 1.

A preferred embodiment of the heat sink to which the present invention is applied will now be described with reference to FIGS. 1 and 2. As shown in FIG. 2, a heat sink 20 includes a base member 22 having an upper surface from which a plurality of radiating fins 21 project upward, a fan assembly 23 provided on the upper surface of the base member 22 for blowing air to the radiating fins 21, and a cover 24 for covering the upper side of the base member 22. The base member 22 and the cover 24 are formed of a material having a high thermal conductivity, such as aluminum. The base member 22 has a lower surface flattened to reduce thermal resistance due to the contact with an integrated circuit package.

Four columns 25A, 25B, 25C, and 25D project upward from the upper surface of the base member 22 at its four corners. The radiating fins 21 are formed on the upper surface of the base member 22 at its another portion except the four corner portions forming the columns 25A to 25D in such a manner as to surround the fan assembly 23. The columns 25A to 25D and the radiating fins 21 are integrally formed with a plate-like portion of the base member 22 which portion forms the upper surface and the lower surface of the base member 22. A blowing passage 26 is defined between the fan assembly 23 fixed to the base member 22 and the arrangement of the radiating fins 21 surrounding the fan assembly 23.

The fan assembly 23 includes a motor (not shown) having a shaft 27 substantially perpendicular to the upper surface of the base member 22, a plurality of fan blades 28 to be rotated by the shaft 27, and a printed wiring board 29 having a drive circuit for the motor. The cover 24 is fixed to the columns 25A to 25D of the base member 22 by means of screws 32. The cover 24 has an opening 30 communicating with the blowing passage 26 through the fan blades 28 of the fan assembly 23. The cover 24 further has a cylindrical projection 31 located just outside the locus of rotation of the fan blades 28. The cylindrical projection 31 functions to restrict the blowing passage 26 and thereby increase a static pressure difference between the opening 30 of the cover 24 and the blowing passage 26, thus effecting efficient blowing.

When electric power is supplied to the fan assembly 23 to rotate the fan blades 28 in a predetermined direction, air is allowed to flow, for example, in a direction from the opening 30 of the cover 24 toward the radiating fins 21 of the base member 22 by the relatively large static pressure difference between the outside of the heat sink 20 and the blowing passage 26 due to the operation of the cylindrical projection 31. Then, the air flow produced above allows good radiation in the radiating fins 21. Alternatively, the air flow may be produced to direct from the radiating fins 21 of the base member 22 toward the opening 30 of the cover 24 by reversing the angle of inclination of the fan blades 28 or reversing the direction of rotation of the fan blades 28.

In this preferred embodiment, the fixed position of the fan assembly 23 with respect to the base member 22 is offset to the column 25A of the four columns 25A to 25D, and the side wall surfaces of the column 25A extend toward the columns 25B and 25D. Such offsetting of the rotational center of the fan assembly 23 from the center of the base member 22 is due to the fact that the blowing power of the fan assembly 23 is higher at its peripheral portion than its central portion, so that it is desirable to locate the peripheral portion of the fan assembly 23 generating a high blowing power at a position substantially according with the center of heat generation in the integrated circuit package (usually, a central portion of the integrated circuit package), thereby effecting efficient radiation.

Further, the extension of the side wall surfaces of the column 25A toward the columns 25B and 25D in the case where the fan assembly 23 is offset to the column 25A is due to the fact that the air blown from the fan assembly 23 must be communicated evenly to all the radiating fins 21. Although the fan assembly 23 is fixed to the base member 22 in this preferred embodiment, the fan assembly 23 may be fixed to the cover 24 to suppress heat transfer from the integrated circuit package to the fan assembly 23, thereby improving the reliability of the fan assembly 23. The use of the heat sink incorporating the fan as shown can greatly improve the radiation of the integrated circuit package. In using such a high-performance heat sink, it is greatly important to ensure a radiation area in the heat sink in order to maintain high radiation characteristics.

A first preferred embodiment of the heat sink mounting structure according to the present invention will now be described in detail with reference to FIGS. 3 to 6. Reference numeral 34 denotes a pin grid array type of integrated circuit package having a plurality of pins 35. The heat sink 20 is mounted on the integrated circuit package 34, and is fastened to the integrated circuit package 34 by using a fastener 36. The fastener 36 is composed of a strip member 38, a pair of forked members 40 integrally connected to opposite ends of the strip member 38, and a pair of engaging members 42 integrally connected to the pair of forked members 40. The strip member 38 and the forked members 40 are integrally formed of stainless steel, for example. The engaging members 42 are formed of resin, and they are connected to the forked members 40.

Figure 3:
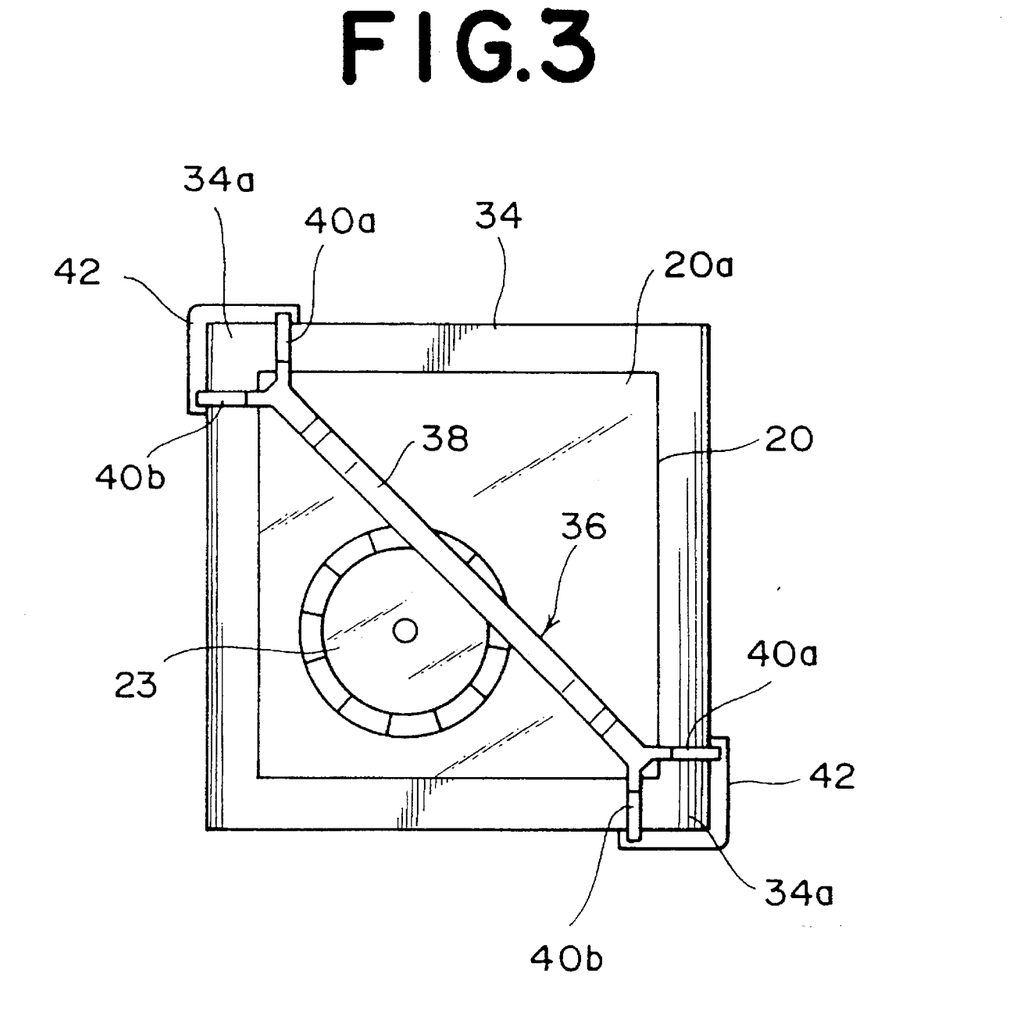
FIG. 3 is a top plan view of a first preferred embodiment of the present invention.
Figure 4:
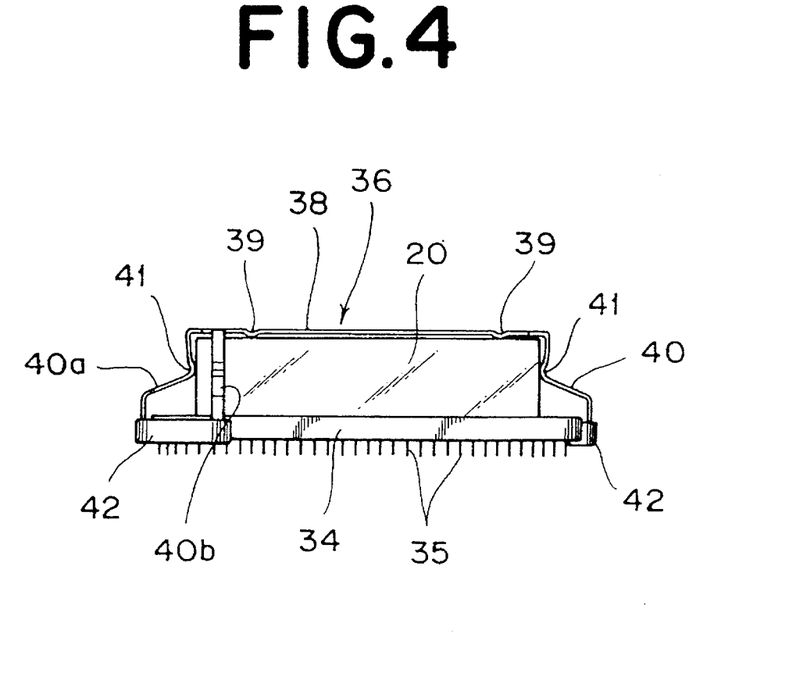
FIG. 4 is a right side view of the first preferred embodiment shown in FIG. 3.
Figure 5:
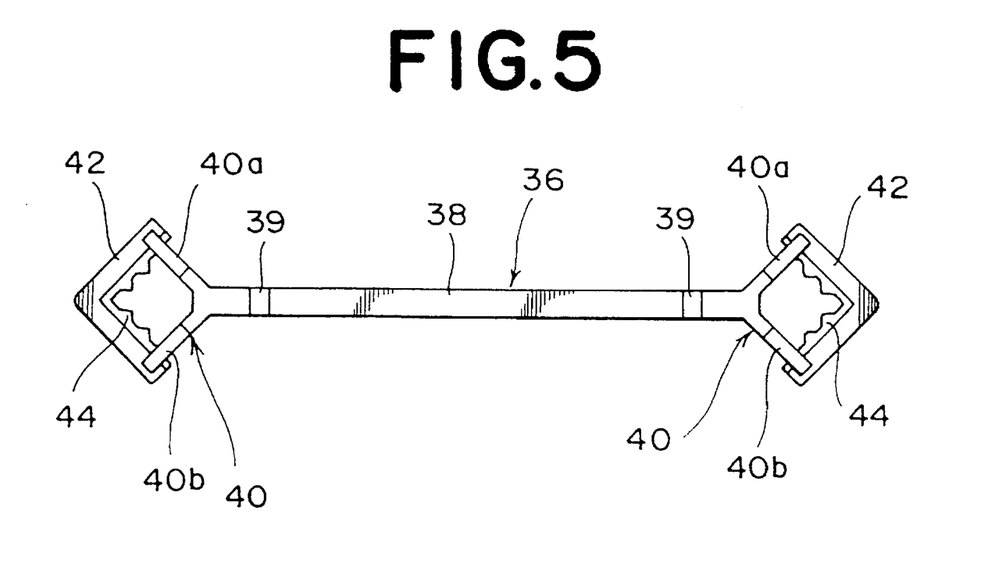
FIG. 5 is a top plan view of a fastener used in the first preferred embodiment.
Figure 6:
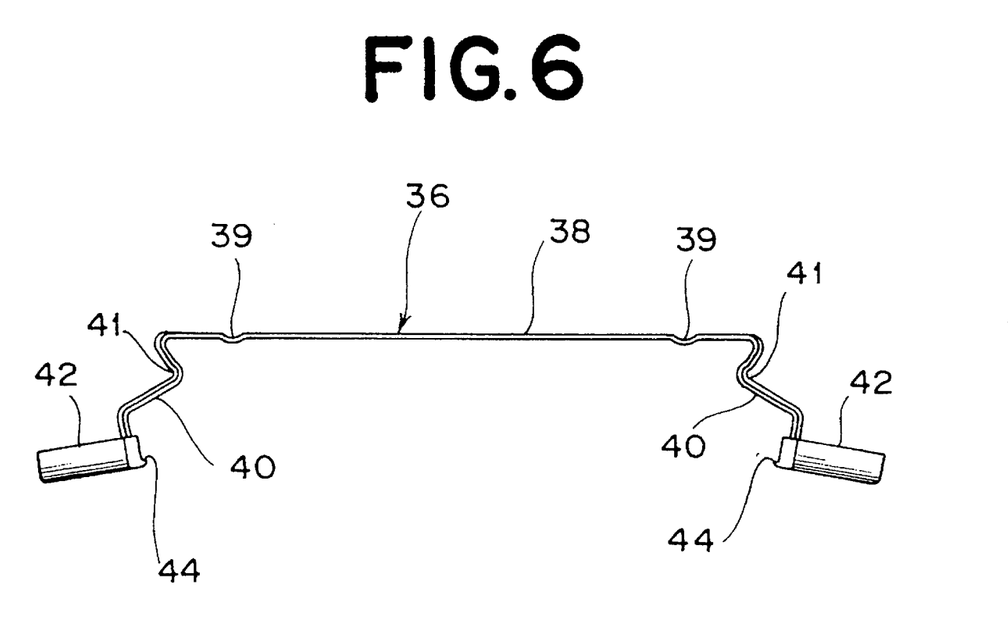
FIG. 6 is an elevational view of the fastener shown in FIG. 5.

The strip member 38 has a pair of depressed portions 39 acting as abutting portions against the heat sink 20. Each forked member 40 includes a first leg 40a and a second leg 40b substantially perpendicular to the first leg 40a. Each of the first and second legs 40a and 40b has a springy pressing portion 41 at a substantially intermediate portion of each leg. Each engaging member 42 has a lug 44 adapted to engage a bottom surface of the integrated circuit package 34 at a corner portion 34a thereof in such a manner that when the heat sink 20 is fastened to the integrated circuit package 34, the lugs 44 of the two engaging members 42 of the fastener 36 come into engagement with the bottom surface of the integrated circuit package 34 at the diagonal corner portions 34a thereof as shown in FIG. 3. The fastener 36 has a size such that when the heat sink 20 is fastened to the integrated circuit package 34, the two engaging members 42 are just fitted with the diagonal corner portions 34a of the integrated circuit package 34.

Thus, the heat sink 20 is mounted on the integrated circuit package 34, and is then fastened to the integrated circuit package 34 with the fastener 36 by engaging the lugs 44 of the two engaging members 42 with the bottom surface of the integrated circuit package 34 at the diagonal corner portions 34a thereof. In this condition, the two depressed portions 39 of the strip member 38 are kept in pressure contact with an upper surface 20a of the heat sink 20, and the four springy pressing portions 41 of the two forked members 40 are also kept in pressure contact with four side surfaces 20b of the heat sink 20, thereby firmly fastening the heat sink 20 to the integrated circuit package 34.

In removing the heat sink 20 from the integrated circuit package 34, it is only necessary to disengage the lugs 44 of the engaging members 42 from the integrated circuit package 34 and accordingly remove the fastener 36. Thus, the heat sink 20 can be easily removed from the integrated circuit package 34 without the use of any tools.

Figure 7A:
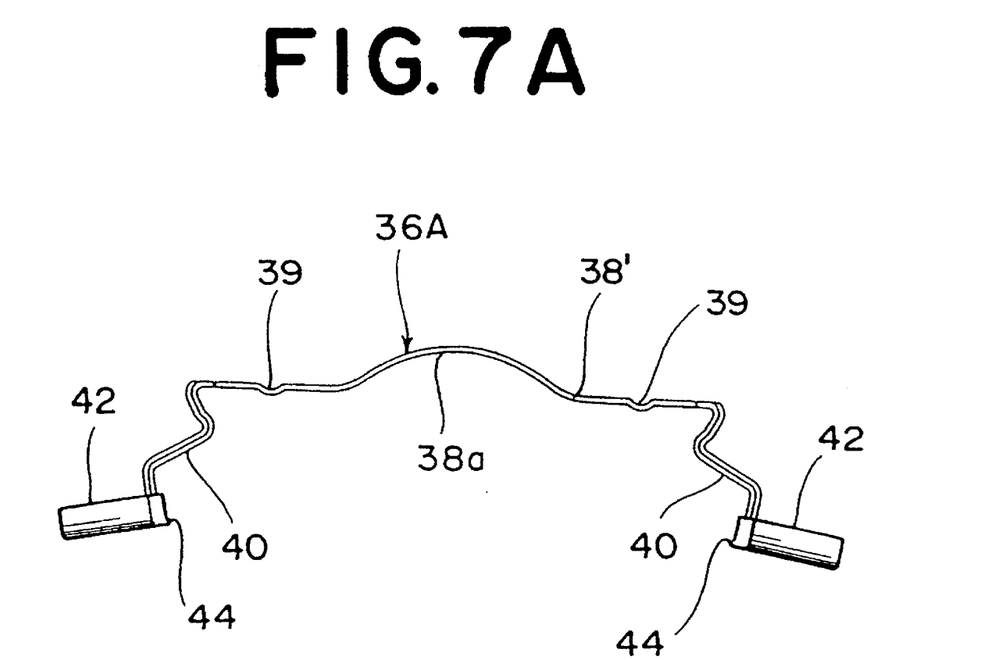
FIGS. 7A and 7B are elevational views of modifications of the fastener in the first preferred embodiment.
Figure 7B:
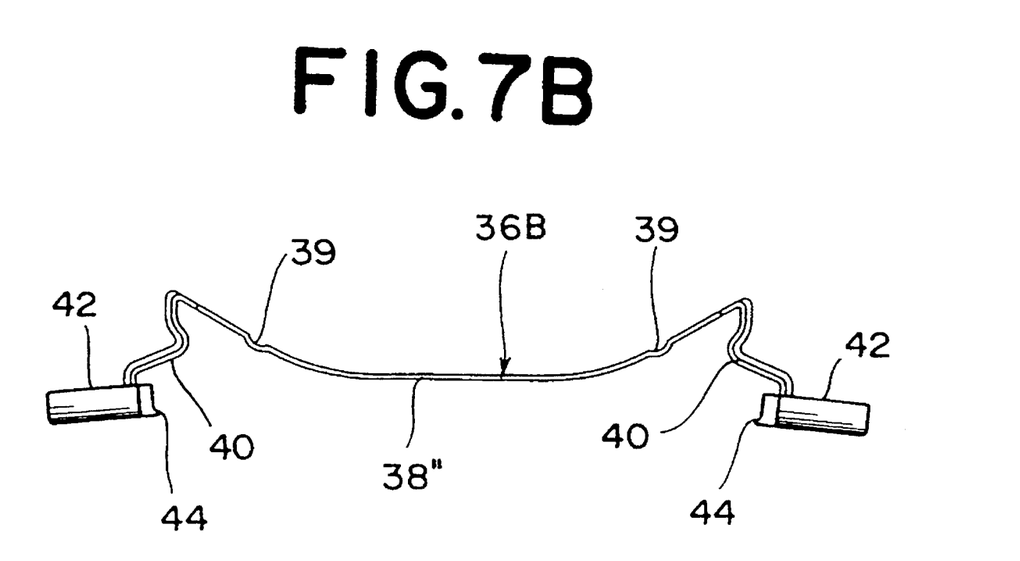
Figure 8:
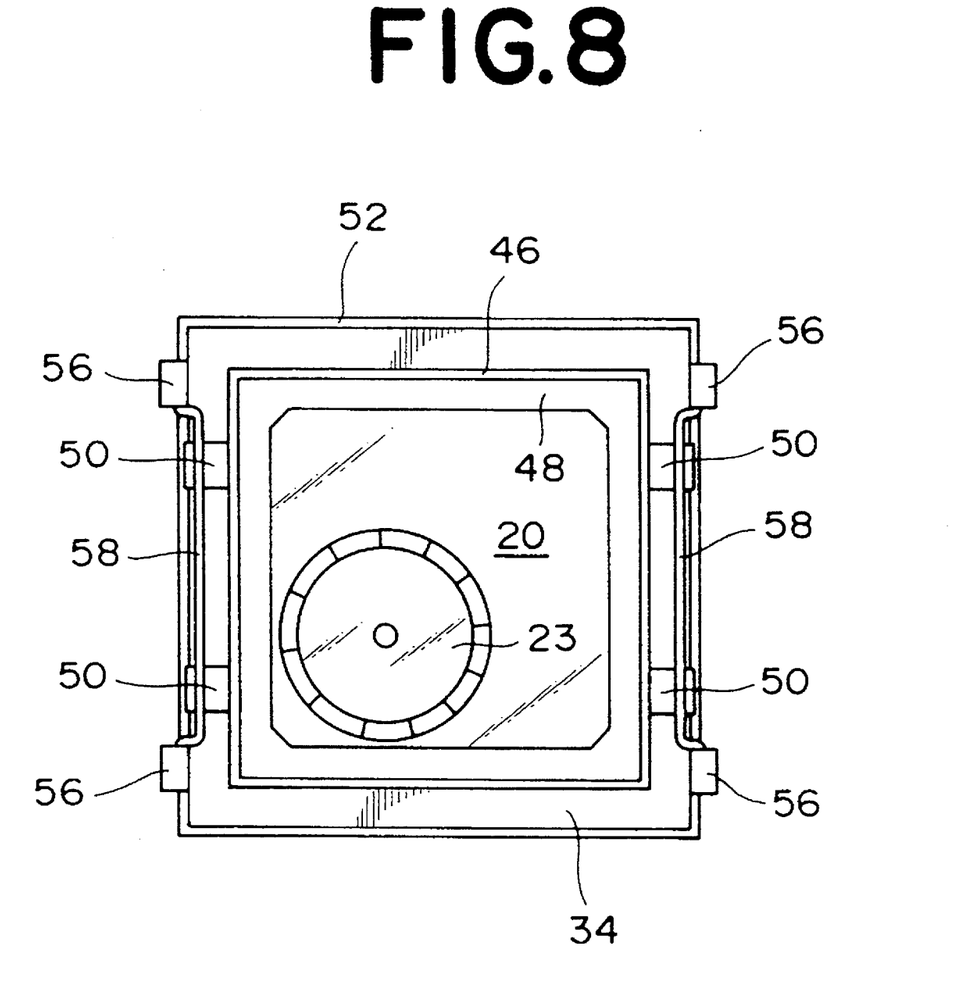
FIG. 8 is a top plan view of a second preferred embodiment of the present invention.

Referring to FIGS. 7A and 7B, there are shown different modifications of the fastener 36 in the first preferred embodiment. A strip member 38' of a fastener 36A shown in FIG. 7A is curved upward at its substantially central portion to form a curved portion 38a. The formation of the curved portion 38a is advantageous such that when the heat sink 20 is fastened to the integrated circuit package 34 by using the fastener 36A as shown in FIG. 3, the blowing operation of the fan assembly 23 is not hindered by the fastener 36A, and air flow resistance can be reduced as compared with that in using the fastener 36.

A strip member 38" of a fastener 36B shown in FIG. 7B is downward curved in its free condition. The strip member 38" is formed of stainless steel and therefore has a springy property. Accordingly, in mounting the fastener 36B, the upper surface 20a of the heat sink 20 can be more firmly pressed by the strip member 38".

A second preferred embodiment of the heat sink mounting structure according to the present invention will now be described with reference to FIGS. 8 to 11. Reference numeral 46 denotes a first frame adapted to be mounted on the heat sink 20, for covering an upper edge portion of the heat sink 20. The first frame 46 is formed of resin, for example. The first frame 46 has a pressing portion 48 projecting horizontally inward for pressing the upper surface of the heat sink 20 at its peripheral edge portion, and also has a plurality of first engaging projections 50 projecting horizontally outward.

Figure 11:
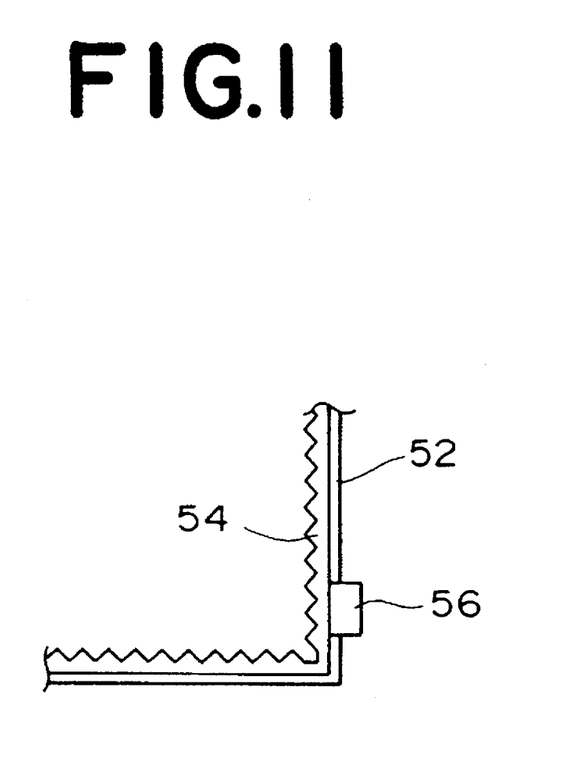
FIG. 11 is a fragmentary top plan view of a second frame used in the second preferred embodiment.

Reference numeral 52 denotes a second frame for surrounding the outer periphery of the integrated circuit package 34. The second frame 52 is also formed of resin, for example. The second frame 52 has a lug 54 projecting horizontally inward as shown in FIG. 11 for abutment against a bottom edge portion of the integrated circuit package 34, and also has a plurality of second engaging projections 56 projecting horizontally outward.

Figure 9:
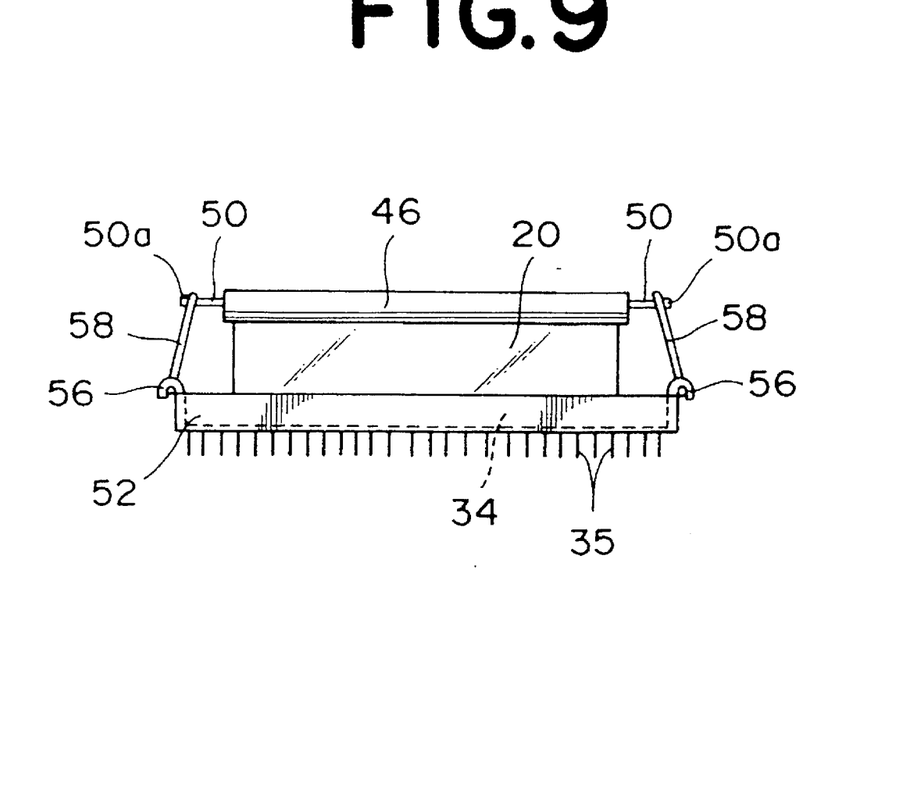
FIG. 9 is an elevational view of the second preferred embodiment shown in FIG. 8.
Figure 10:
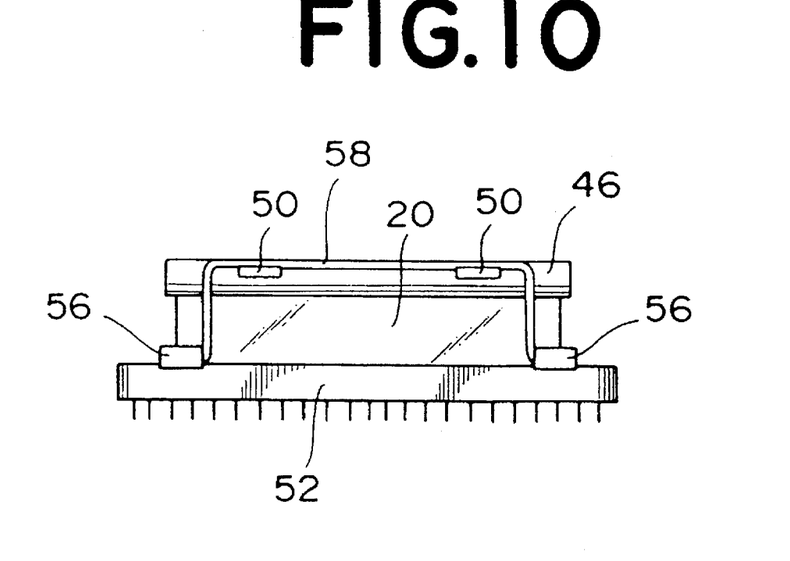
FIG. 10 is a side view of the second preferred embodiment shown in FIG. 8.

As best shown in FIGS. 9 and 10, a pair of substantially crank-shaped fastening members 58 formed of metal are engaged with both the first engaging projections 50 of the first frame 46 and the second engaging projections 56 of the second frame 52, thus fastening the first frame 46 to the second frame 52 with the heat sink 20 securely held therebetween. To prevent accidental disengagement of the fastening members 58, a stop 50a is formed at an outer end of each first engaging projection 50, and as shown in FIG. 9, each second engaging projection 56 is bent. Also in this preferred embodiment, the heat sink 20 can be removably mounted on the integrated circuit package 34 without the use of any special tools.

Figure 12A:
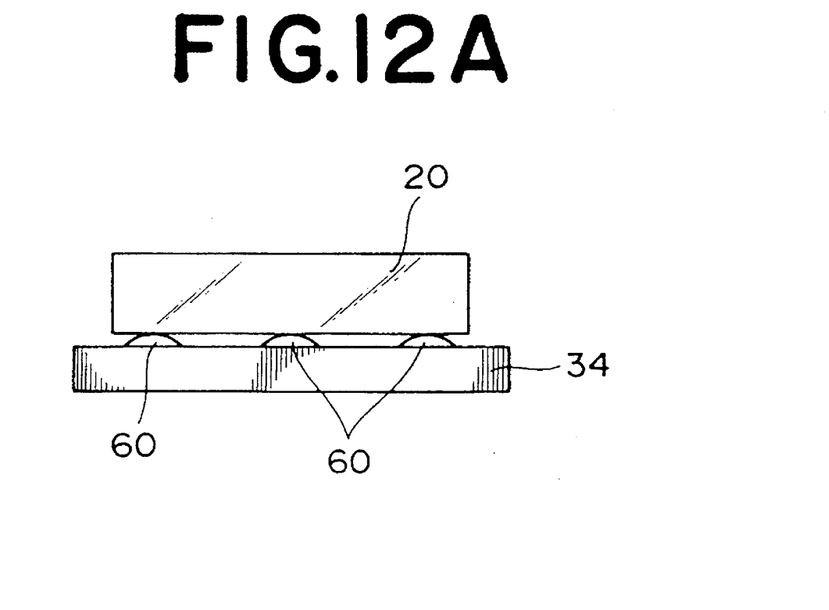
FIG. 12A is an elevational view of a third preferred embodiment of the present invention.
Figure 12B:
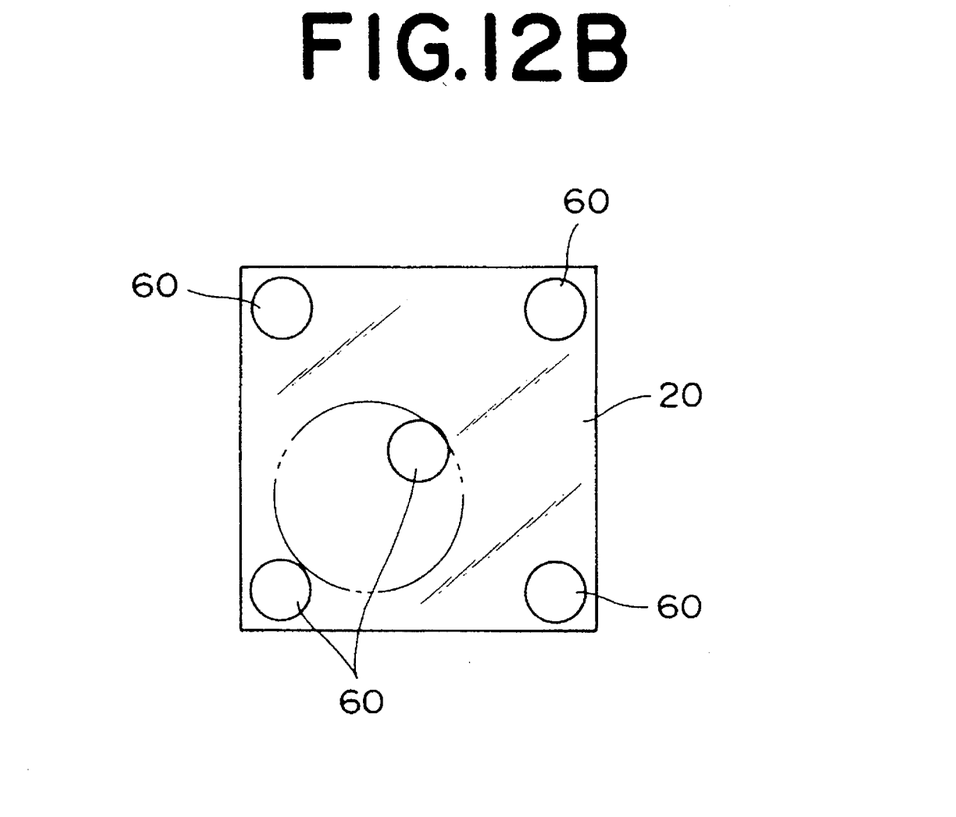
FIG. 12B is a bottom plan view of a heat sink shown in FIG. 12A.

FIGS. 12A and 12B show a third preferred embodiment of the present invention, in which FIG. 12A is an elevational view of the heat sink 20 mounted on the integrated circuit package 34, and FIG. 12B is a bottom plan view of the heat sink 20 removed from the integrated circuit package 34. In this preferred embodiment, a plurality of suction cups 60 formed of a material having a good thermal conductivity, such as silicone rubber, are bonded to the bottom surface of the heat sink 20 by using epoxy adhesive. The suction cups 60 bonded to the heat sink 20 are applied to the upper surface of the integrated circuit package 34 as shown in FIG. 12A, thereby making the suction cups 60 stick to the upper surface of the integrated circuit package 34. Thus, the heat sink 20 can be easily fastened through the suction cups 60 to the integrated circuit package 34.

Figure 13A:
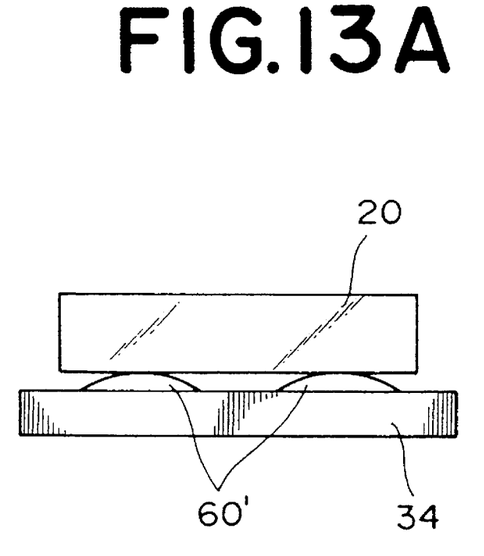
FIG. 13A is an elevational view of a modification of the third preferred embodiment.
Figure 13B:
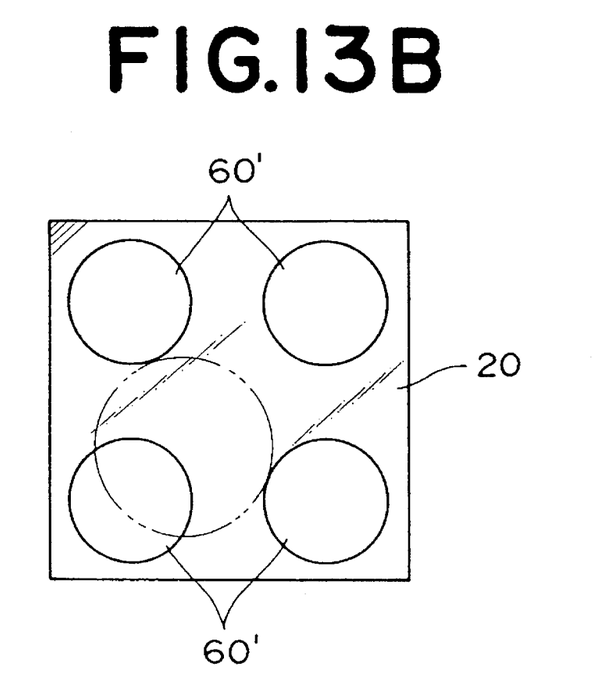
FIG. 13B is a bottom plan view of a heat sink shown in FIG. 13A.

FIGS. 13A and 13B show a modification of the third preferred embodiment, in which FIG. 13A is an elevational view of the heat sink 20 mounted on the integrated circuit package 34, and FIG. 13B is a bottom plan view of the heat sink 20 removed from the integrated circuit package 34. In this modification, a plurality of suction cups 60' larger in diameter than the suction cups 60 are used to improve the thermal conductivity of the suction cups 60.

Figure 14:
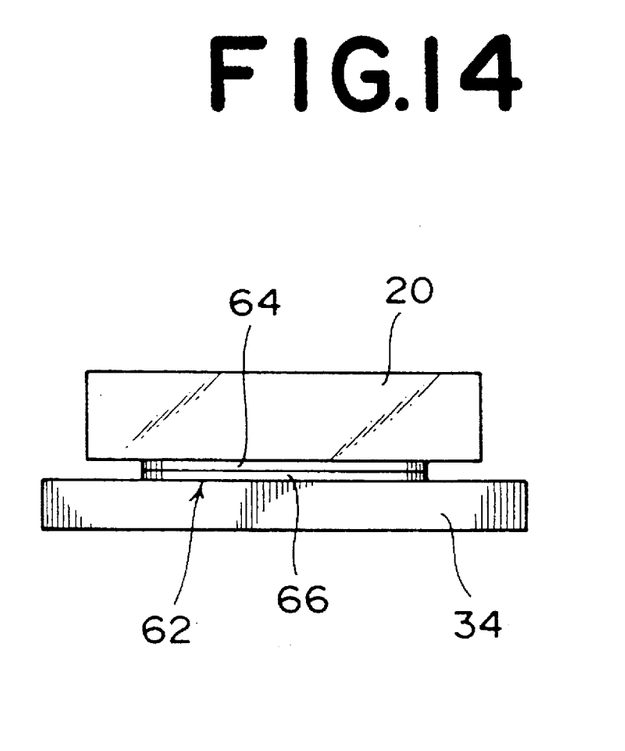
FIG. 14 is an elevational view of a fourth preferred embodiment of the present invention.

Referring to FIG. 14, there is shown an elevational view of a fourth preferred embodiment of the present invention.

Figure 15A:
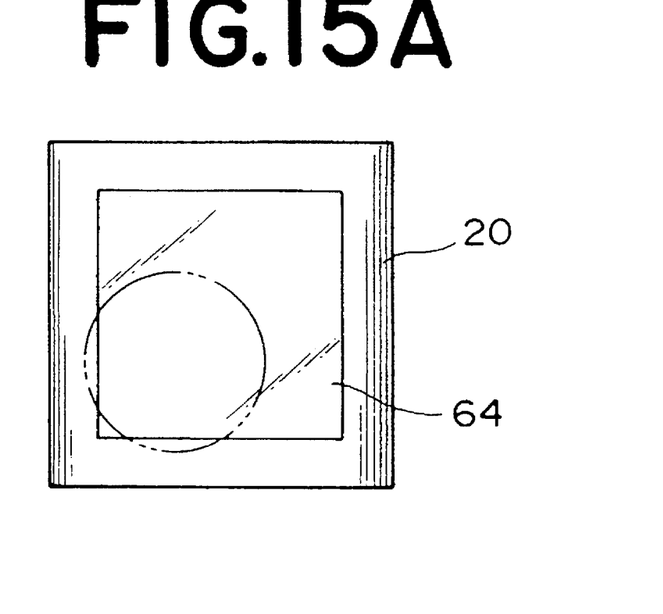
FIG. 15A is a bottom plan view of a heat sink shown in FIG. 14.
Figure 15B:
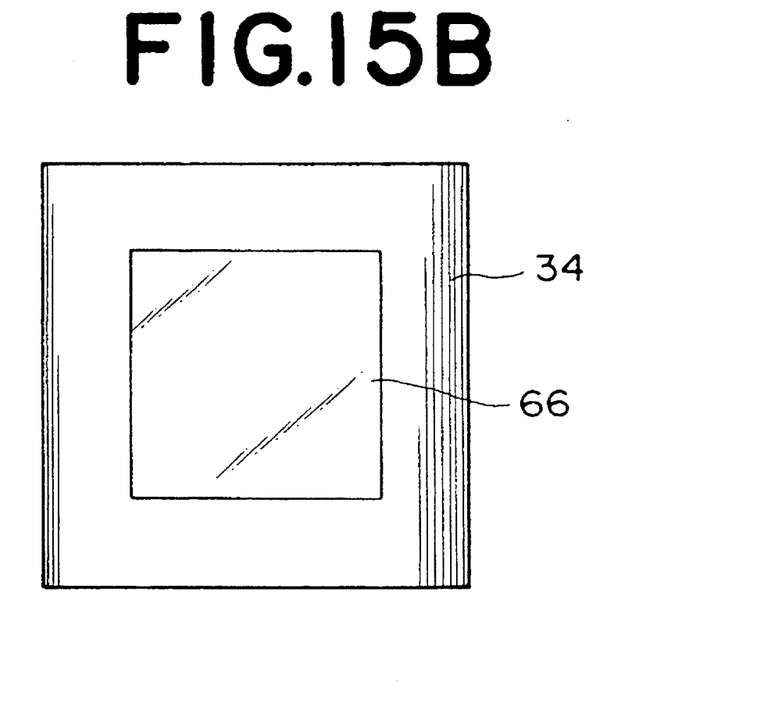
FIG. 15B is a top, plan view of an integrated circuit package shown in FIG. 14.

In this preferred embodiment, a Velcro fastener 62 is used to mount the heat sink 20 on the integrated circuit package 34. More specifically, as shown in FIG. 15A, a hook tape 64 as one element of the Velcro fastener 62 is bonded to the bottom surface of the heat sink 20, and as shown in FIG. 15B, a loop tape 66 as the other element of the Velcro fastener 62 is bonded to the upper surface of the integrated circuit package 34.

The hook tape 64 is engaged with the loop tape 66 to thereby mount the heat sink 20 on the integrated circuit package 34. Both the hook tape 64 and the loop tape 66 are formed of a material having a good thermal conductivity, such as silicone resin. Alternatively, the loop tape 66 may be bonded to the bottom surface of the heat sink 20, and the hook tape 64 may be bonded to the upper surface of the integrated circuit package 34.

As described above, the present invention can provide a heat sink mounting structure which can increase a cooling efficiency and easily mount a heat sink to an integrated circuit package. Further, the present invention can provide a fastener suitable for mounting of a heat sink to an integrated circuit package.

What is claimed is:

1. A heat sink mounting structure comprising:

an integrated circuit package;

a heat sink mounted on said integrated circuit package; and fastening means for fastening said heat sink to said integrated circuit package so that a lower surface of said heat sink comes into close contact with an upper surface of said integrated circuit package, said fastening means comprising a strip member, a pair of forked members integrally connected to opposite ends of said strip member, and a pair of engaging members integrally connected to said pair of forked members;

wherein said strip member overlies said heat sink without obstructing said heat sink, said engaging members are forked such that they latch under said integrated circuit package at regions adjacent to and spaced away from diagonal corner portions of said integrated circuit package, and said forked members are adapted to come into pressure contact with side surfaces of said heat sink; and wherein said engaging members do not contact diagonal corners of said integrated circuit package.

2. A heat sink mounting structure according to claim 1, wherein said strip member has a depressed portion adapted to come into pressure contact with an upper surface of said heat sink, and each of said forked members has a first leg and a second leg substantially perpendicular to said first leg, each of said first leg and said second leg having a springy pressing portion adapted to come into pressure contact with each of said side surfaces of said heat sink.

3. A heat sink mounting structure according to claim 2, wherein each of said engaging members has a lug adapted to engage a bottom surface of said integrated circuit package at each of said diagonal corner portions.

4. A heat sink mounting structure according to claim 1, wherein said heat sink has a built-in fan, and said strip member has a curved portion upwardly curved so as not to hinder ventilation by said fan.

5. A fastener for fastening a heat sink to an integrated circuit package, comprising:

a strip member;

a pair of forked members integrally connected to opposite ends of said strip member, each of said forked members having a first leg and a second leg substantially perpendicular to said first leg; and wherein said pair of forked members latch under said integrated circuit package at respective regions adjacent to and spaced away from diagonal corner portions of said integrated circuit package, and said engaging members do not contact diagonal corners of said integrated circuit package; and a pair of engaging members integrally connected to said pair of forked members, each of said engaging members having a lug engaging with a bottom surface of said integrated circuit package at each of diagonal corner portions of said integrated circuit package when said heat sink is fastened to said integrated circuit package.

6. A fastener according to claim 5, wherein said strip member has a depressed portion coming into pressure contact with an upper surface of said heat sink when said heat sink is fastened to said integrated circuit package.

7. A fastener according to claim 5, wherein each of said first leg and said second leg of said each forked member has a springy pressing portion coming into pressure contact with a side surface of said heat sink.

8. A heat sink mounting structure comprising:

an integrated circuit package;

a heat sink mounted on said integrated circuit package; and fastening means for fastening said heat sink to said integrated circuit package so that a lower surface of said heat sink comes into close contact with an upper surface of said integrated circuit package;

wherein said fastening means comprises a first frame for covering an upper edge portion of said heat sink, said first frame having a pressing portion adapted to abut against an upper surface of said heat sink and a plurality of first engaging projections projecting horizontally outward; a second frame for surrounding an outer periphery of said integrated circuit package, said second frame having a lug adapted to abut against a bottom edge portion of said integrated circuit package and a plurality of second engaging projections projecting horizontally outward; and a pair of fastening members for engaging together said first engaging projections and said second engaging projections for removably fastening said heat sink to said integrated circuit package.

9. A heat sink mounting structure comprising:

an integrated circuit package;

a heat sink mounted on said integrated circuit package; and a plurality of suction cups bonded to a bottom surface of said heat sink and adapted to stick to an upper surface of said integrated circuit package, each of said suction cups being formed of a material having a good thermal conductivity.

10. A heat sink mounting structure comprising:

an integrated circuit package;

a heat sink mounted on said integrated circuit package;

a first fastener bonded to a bottom surface of said heat sink, said first fastener being formed of a material having a good thermal conductivity; and a second fastener bonded to an upper surface of said integrated circuit package and adapted to engage said first fastener, said second fastener being formed of a material having a good thermal conductivity; wherein said first fastener comprises one portion of a hook-and-loop fastener means and said second fastener comprises another portion of the hook-and-loop fastener.

* * * * *